(12) United States Patent
Kueck et al.

(10) Patent No.: US 10,056,365 B2
(45) Date of Patent: Aug. 21, 2018

(54) SEMICONDUCTOR DEVICE

(71) Applicant: Infineon Technologies Austria AG, Villach (AT)

(72) Inventors: Daniel Kueck, Villach (AT); Rudolf Elpelt, Erlangen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/628,721

(22) Filed: Feb. 23, 2015

(65) Prior Publication Data

US 2015/0171078 A1 Jun. 18, 2015

Related U.S. Application Data

(63) Continuation of application No. 13/537,180, filed on Jun. 29, 2012, now Pat. No. 8,994,078.

(51) Int. Cl.
*H01L 27/02* (2006.01)
*H01L 27/06* (2006.01)
(Continued)

(52) U.S. Cl.
CPC ...... *H01L 27/0629* (2013.01); *H01L 29/0615* (2013.01); *H01L 29/0646* (2013.01); *H01L 29/0649* (2013.01); *H01L 29/407* (2013.01); *H01L 29/41741* (2013.01); *H01L 29/41775* (2013.01); *H01L 29/42316* (2013.01); *H01L 29/8083* (2013.01); *H01L 29/8122* (2013.01); *H01L 29/8613* (2013.01); *H01L 29/1608* (2013.01)

(58) Field of Classification Search
CPC ......... H01L 29/48; H01L 29/10; H01L 27/02; H01L 29/34; H01L 23/58; H01L 21/336; H01L 29/94; H01L 27/06; H01L 29/78; H01L 21/265
USPC ....... 257/471, 472, 475, 476, 480, 481, 482, 257/485, 339, 341, 342, 329, 330, 331, 257/334, 337
See application file for complete search history.

(56) References Cited

U.S. PATENT DOCUMENTS 3,290,569 A * 12/1966 Kessler ................. G11C 19/28
257/66
5,049,953 A 9/1991 Mihara et al.
(Continued)

FOREIGN PATENT DOCUMENTS

DE 10145765 4/2003
WO 9723911 7/1997
(Continued)

*Primary Examiner* — Mouloucoulaye Inoussa
(74) *Attorney, Agent, or Firm* — Murphy, Bilak & Homiller, PLLC

(57) ABSTRACT

A semiconductor device incudes a cell region and a contact region, the cell region including a functional unit including a gate electrode, a source and a drain electrode, and the contact region including a gate pad. The gate electrode, the gate pad and the source electrode are disposed on a first main surface of a semiconductor substrate, and the drain electrode is disposed on a second main surface of the semiconductor substrate, the second main surface being opposite to the first main surface. A shielding member is disposed between the gate pad and the drain electrode, the shielding member being electrically connected to the source electrode.

15 Claims, 4 Drawing Sheets

(51) Int. Cl.
*H01L 29/40* (2006.01)
*H01L 29/808* (2006.01)
*H01L 29/812* (2006.01)
*H01L 29/06* (2006.01)
*H01L 29/417* (2006.01)
*H01L 29/423* (2006.01)
*H01L 29/861* (2006.01)
H01L 29/16 (2006.01)

(56) References Cited

U.S. PATENT DOCUMENTS

| | | | |
|---|---|---|---|
| 5,543,637 A | 8/1996 | Baliga | |
| 6,423,986 B1* | 7/2002 | Zhao | H01L 29/16 |
| | | | 257/110 |
| 6,600,192 B1* | 7/2003 | Sugawara | H01L 29/1066 |
| | | | 257/329 |
| 7,449,762 B1 | 11/2008 | Singh | |
| 2002/0056884 A1 | 5/2002 | Baliga | |
| 2006/0255373 A1* | 11/2006 | Elpelt | H01L 29/0634 |
| | | | 257/256 |
| 2010/0123220 A1 | 5/2010 | Burke et al. | |
| 2010/0193864 A1 | 8/2010 | Tokuda | |
| 2010/0264467 A1 | 10/2010 | Peters et al. | |
| 2012/0012902 A1* | 1/2012 | Elpelt | H01L 29/1066 |
| | | | 257/265 |

FOREIGN PATENT DOCUMENTS

| WO | 9849762 | 11/1998 |
|---|---|---|
| WO | 0016402 | 3/2000 |

\* cited by examiner

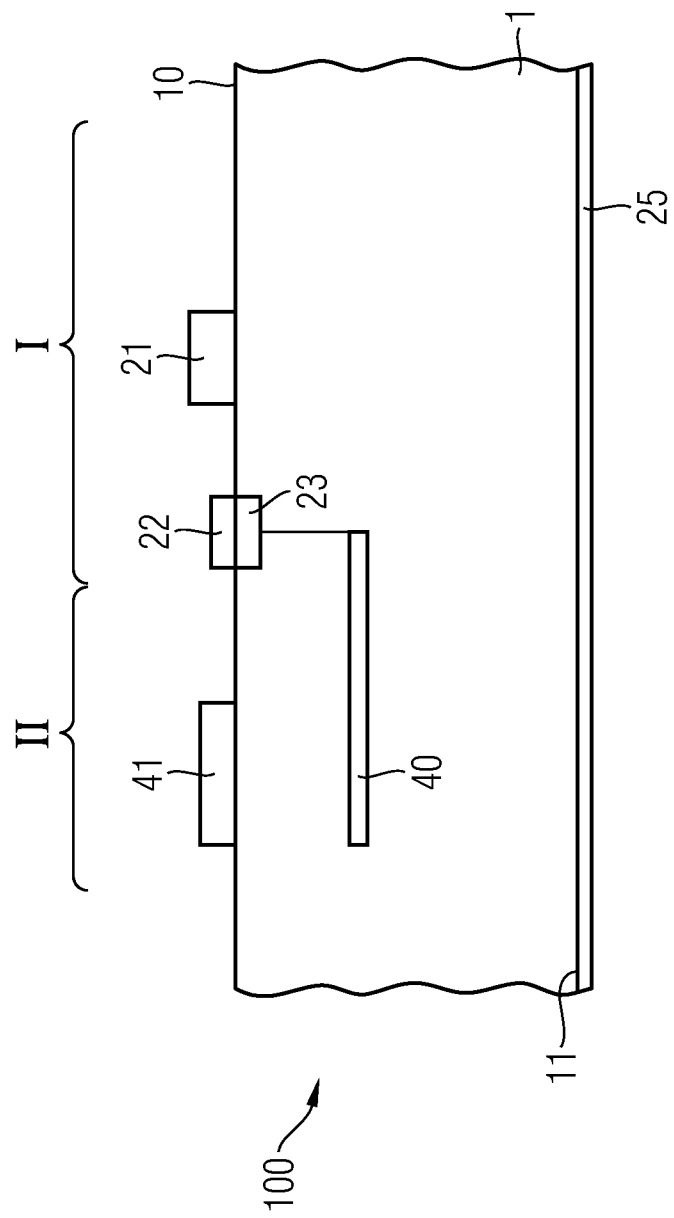

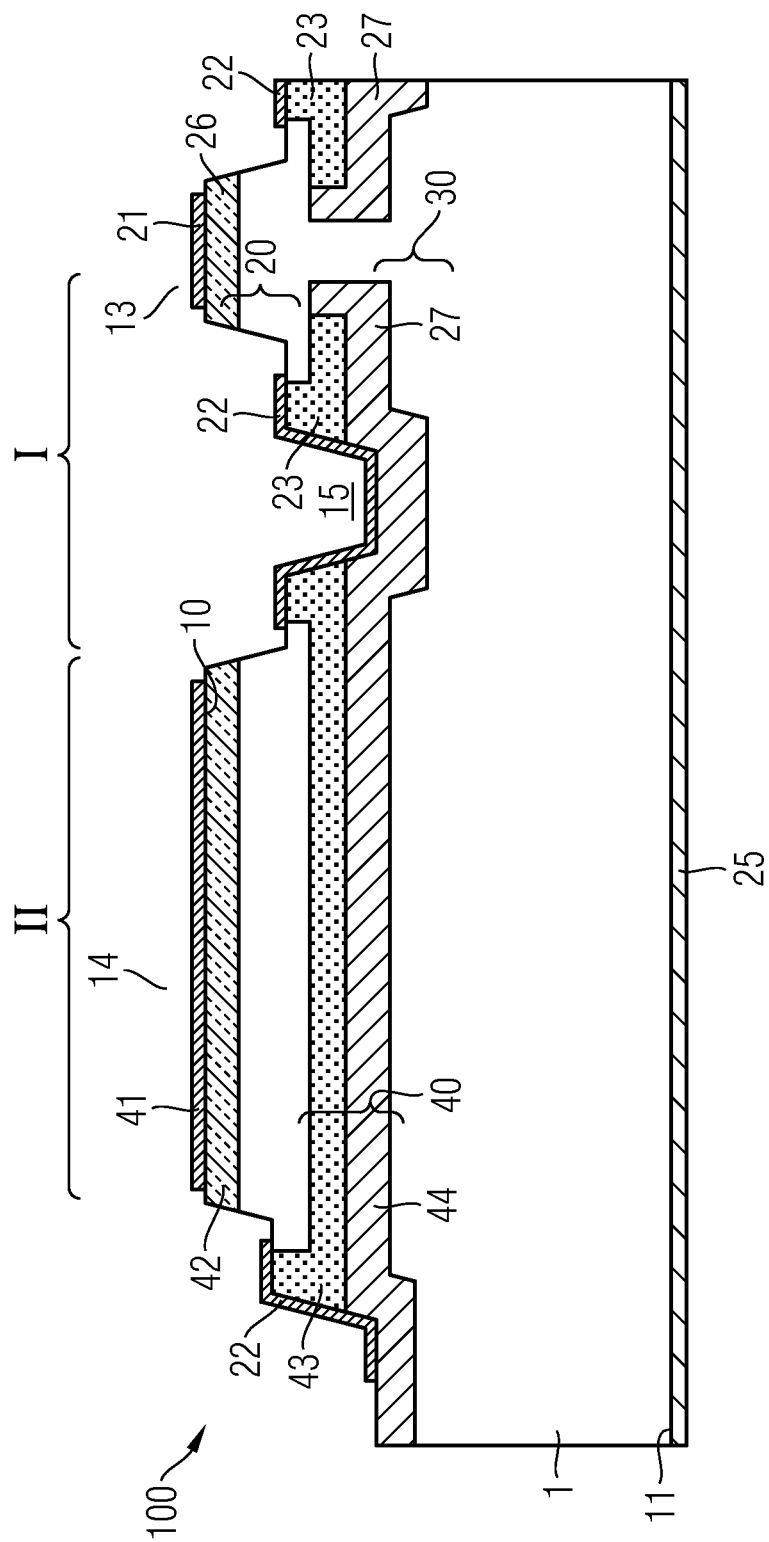

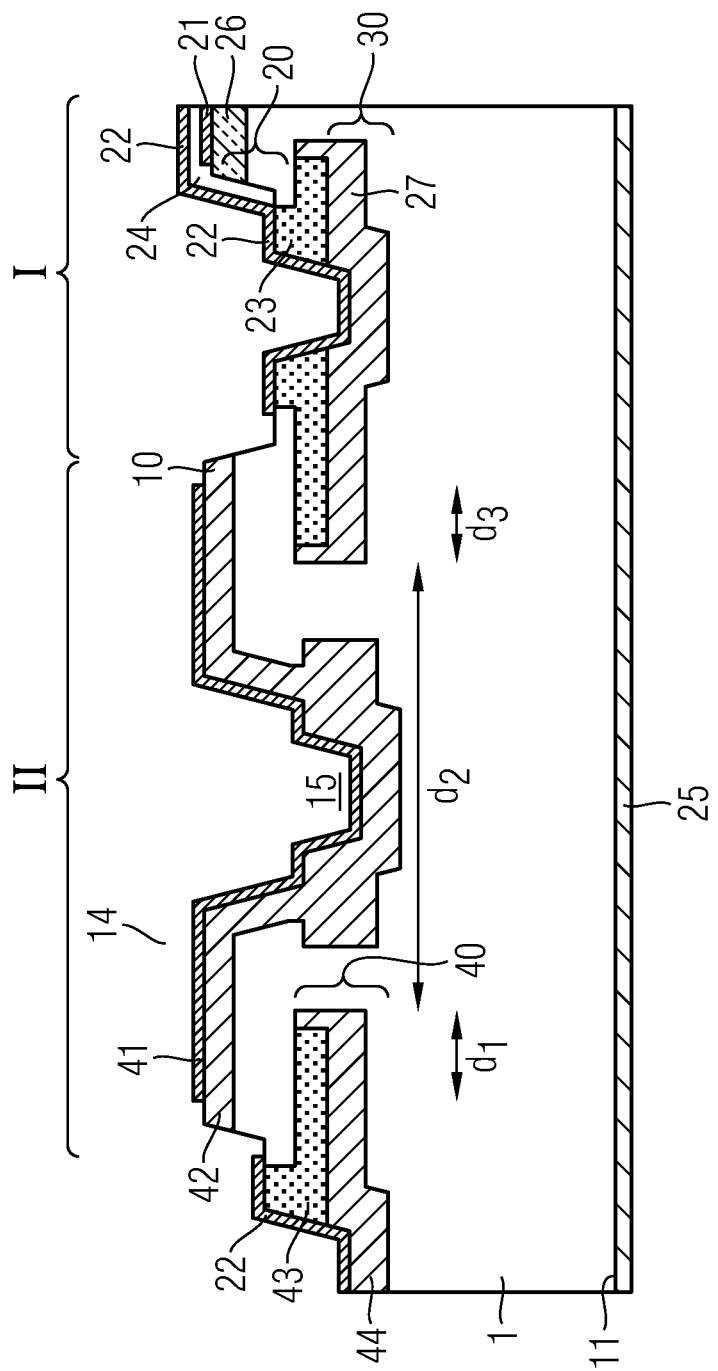

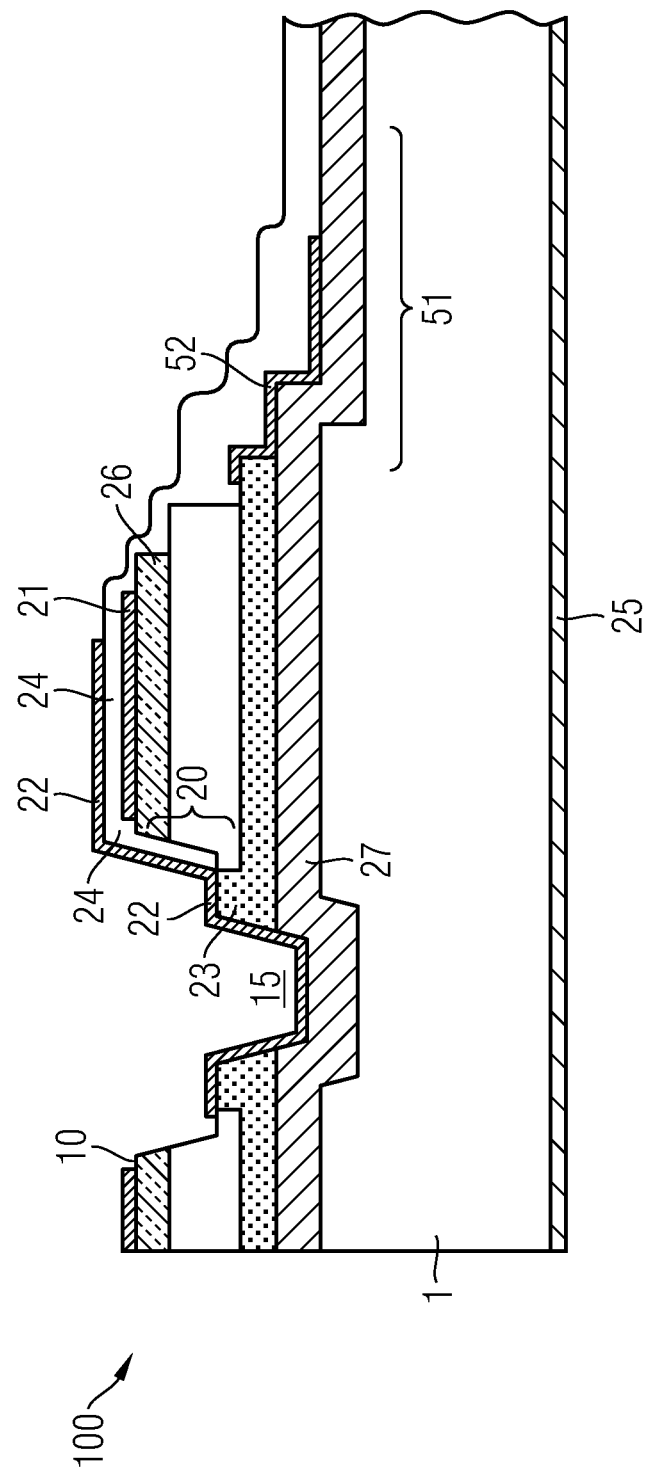

US 10,056,365 B2

SEMICONDUCTOR DEVICE

BACKGROUND

Semiconductor devices comprising silicon carbide (SiC) as a base material have become recently important in the field of power devices. For example, solar inverters may comprise a SiC JFET (junction field effect transistor) in which the source electrode and the gate electrode are disposed on one side of the semiconductor device and the drain electrode is on the back side of the semiconductor device. Such a semiconductor device further comprises a bipolar diode that is integrated between the source electrode and the back side drain contact of the JFET.

In these devices, it is desirable to increase the $C_{GS}/C_{GD}$ ratio, which is the ratio of the gate-source capacitance to the gate-drain capacitance.

SUMMARY

According to an embodiment, a semiconductor device comprises a cell region and a contact region, the cell region comprising a functional unit including a gate electrode, a source and a drain electrode, the contact region comprising a gate pad, the gate electrode, the gate pad and the source electrode being disposed on a first main surface of a semiconductor substrate, the drain electrode being disposed on a second main surface of the semiconductor substrate, the second main surface being opposite to the main surface, and a shielding member disposed within the semiconductor substrate between the gate pad and the drain electrode, the shielding member being electrically connected to the source electrode.

According to a further embodiment, an integrated circuit includes a semiconductor device comprising a cell region and a contact region, the cell region comprising a functional unit including a gate electrode, a source and a drain electrode, the contact region comprising a gate pad, the gate electrode, the gate pad and the source electrode being disposed on a first main surface of a semiconductor substrate, the drain electrode being disposed on a second main surface of the semiconductor substrate, the second main surface being opposite to the first main surface, and a shielding member disposed between the gate pad and the drain electrode, the shielding member being electrically connected to the source electrode.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1 illustrates a general embodiment of the present application;

FIG. 2 illustrates a further embodiment of the present application;

FIG. 3 illustrates still a further embodiment of the present application; and

FIG. 4 illustrates a further embodiment of the present application.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", "over", "above", "below", etc., is used with reference to the orientation of the Figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing processes have been designated by the same references in the different drawings if not stated otherwise.

The terms "lateral" and "horizontal" as used in this specification intend to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The Figures and the description illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The terms "wafer", "substrate" or "semiconductor substrate" used in the following description may include any semiconductor-based structure that has a semiconductor surface. According to embodiments of the present application, generally, silicon carbide (SiC) is an example of the semiconductor substrate material. Nevertheless, the semiconductor substrate material may as well include silicon, silicon-on-insulator (SOI), silicon-on sapphire (SOS), doped and undoped semiconductors, epitaxial layers of silicon supported by a base semiconductor foundation, and other semiconductor structures. The semiconductor material may as well include further materials such as silicon-germanium, germanium, or gallium arsenide.

Terms such as "first", "second", and the like, are used to describe various structures, elements, regions, sections, etc. and are not intended to be limiting. Like terms refer to like elements throughout the description.

It is to be understood that the features of the various embodiments described herein may be combined with each other, unless specifically noted otherwise.

FIG. 1 schematically illustrates a general embodiment of the present application. A semiconductor device 100 includes a cell region I and a contact region II. The cell region I includes a functional unit including a gate electrode 21, a source electrode 22 and a drain electrode 25. For example, the gate electrode 21, the source electrode 22 and the drain electrode 25 may form any kind of a transistor, such as a JFET (junction field effect transistor), MOSFET (metal oxide semiconductor field effect transistor), IGBT (insulated gate bipolar transistor) and others. The contact portion II includes a gate pad 41 which is connected with the gate electrode 21. The gate electrode 21, the gate pad 41 and the source electrode 22 are disposed on a first main surface 10 of a semiconductor substrate 1. The drain electrode 25 is disposed on a second main surface 11 of the semiconductor substrate 1, the second main surface 11 being opposite to the first main surface 10. The semiconductor device 100 further includes a shielding member 40 which is disposed between the gate pad 41 and the drain electrode 25, the shielding member 40 being electrically connected to the source electrode 22. The shielding member 40 may be disposed within the semiconductor substrate 1. The shielding member 40 is disposed so as to be capacitively coupled to the gate pad 41 and to the drain electrode 25. Accordingly, the size of the gate pad 41 contributes to the gate-source capacitance and its contribution to the gate-drain capacitance is remarkably reduced. As a consequence the ratio of $C_{GS}/C_{GD}$ is increased.

FIG. 2 illustrates a further embodiment of the present application. The semiconductor device 100 illustrated in FIG. 2 includes a semiconductor substrate 1 which may be, for example, silicon carbide, which is heavily n-doped. As to be clearly understood, the embodiments may as well be implemented using other semiconductor materials than the above. Further, the type of doping and the doping concentration may be different from heavily n-doped.

The semiconductor substrate 1 includes a first main surface 10 and a second main surface 11, the second main surface 11 being opposite to the first main surface 10. The first and the second main surfaces 10, 11 may be planar surfaces. The first main surface 10 may be structured so as to include mesas 13, 14 and grooves 15. The semiconductor substrate 1 may include a cell region I and a contact region II. For example, the semiconductor substrate 1 may be structured to include a cell mesa 13 that is disposed in the cell region I and a pad mesa 14 that is disposed in the contact region II. A functional unit including a gate electrode 21, a source electrode 22 and a drain electrode 25 may be disposed in the cell region I. The gate electrode 21 may be disposed on top of the cell mesa 13. The gate electrode 21 may form a Schottky contact to the substrate 1. According to an embodiment, a p-doped semiconductor portion 26 may be disposed between the gate electrode 21 and the semiconductor substrate 1, thus forming a pn-junction that may insulate the gate electrode 21 from the semiconductor substrate 1. According to this embodiment, the gate electrode 21 may form an ohmic contact to this pn-junction.

The source electrode 22 may form an ohmic contact to the substrate 1 via a doped portion 23. For example, the doped portion 23 may be $n^+$-doped. The drain electrode 25 may be disposed on a back side or on the second main surface 11 of the semiconductor substrate 1 and may form an ohmic contact to the semiconductor substrate 1. In the embodiment illustrated in FIG. 2, the functional unit including the gate electrode 21, the source electrode 22 and the drain electrode 25 form a so-called junction field effect transistor (JFET) 20. A current flow from the source electrode 22 to the drain electrode 25 may be controlled via the field-effect by applying a gate voltage to the gate electrode 21. As is to be clearly understood, according to a further embodiment, the gate electrode 21 may form a MOS contact to the substrate 1, with an insulating layer or gate dielectric being disposed between the gate electrode 21 and the substrate 1.

According to the embodiment illustrated in FIG. 2, the source electrode 22 may also be connected to a p+-doped region 27. The $p^+$-doped region 27 and the adjacent portion of the $n^-$-doped substrate 1 form a body diode 30 which is disposed between the JFET 20 and the drain electrode 25.

The gate electrode 21, the source electrode 22 and the drain electrode 25 may be formed of any suitable metal, metal alloy or metal compound. For example, the source electrode 22 may be formed of AlCu or NiAl. As is to be clearly understood, the functional unit may be implemented in any further arbitrary manner, including further functional elements and being arranged according to arbitrary designs. Moreover, some of the described components may be modified or even omitted.

The contact region II includes a pad mesa 14 on which a gate pad 41 is disposed. The gate pad 41 is in contact with a $p^+$-doped region 42 of the semiconductor substrate 1. The gate pad 41 is connected with the gate electrode 21 and enables electrical contact to further components or external circuiting.

According to an embodiment, on a chip, the gate electrode 21 may have the shape of a stripe with a certain length. The gate pad 41 may have a smaller size and may, for example, have a rectangular shape. The cross-sectional view of FIG. 2 is taken in a direction intersecting the length direction of the gate electrode 21. For example, the cell including the semiconductor device may have a quadratic shape.

The semiconductor device 100 shown in FIG. 2 further includes a shielding member 40 which is disposed between the gate pad 41 and the drain electrode 25. The shielding member 40 is connected to the source electrode 22. The shielding member 40 may be electrically insulated from the gate pad 41 and the drain electrode 25. For example, the shielding member 40 is formed of a pn junction. As a consequence, the gate pad 41 contributes to the capacitance between the gate electrode 21 and the source electrode 22 and does not significantly contribute to the capacitance between the gate electrode 21 and the drain electrode 25 which would be the case if no shielding member 40 were present. As a consequence, the gate-source capacitance is increased whereas the gate-drain capacitance is reduced.

In the embodiment shown in FIG. 2, the shielding member 40 includes doped portions. Nevertheless, as is to be clearly understood, the shielding member 40 could as well be implemented in a different manner, for example, by a thin metal layer or otherwise. In the embodiment illustrated in FIG. 2, the shielding member 40 includes a p+-doped region 44 and an n+-doped portion 43. In the embodiment shown in FIG. 2, at least one of the doped portions 43, 44 is at the same height as a doped portion 23, 27 of the cell region I. For example, the cell region I may include a $n^+$-doped source contact portion 23. In this case, for example, an $n^+$-doped portion 43 of the shielding member 40 may be disposed at the same height as the n+-doped source contact portion 23. Further, the shielding member may include a $p^+$-doped portion 44 which may be disposed at the same height as the $p^+$-doped portion 27 of the body diode 30. By this configuration, the manufacture of the semiconductor device 100 may be simplified.

According to a further embodiment, the cell mesa 13 may be disposed at the same height as the pad mesa 14, thereby simplifying the manufacture of the semiconductor device 100.

According to an embodiment, the gate pad 41 may be disposed on top of the pad mesa 14. In the embodiment shown in FIG. 2, the pad mesa 14 has a certain width extending along a lateral direction with respect to a second main surface 11 of the semiconductor substrate 1. The shielding member 40 may be disposed so as to extend over the whole width of the pad mesa 14 and the gate pad 41. According to this embodiment, the width and the height of the pad mesa 14 contribute to a gate-source capacitance of the semiconductor device 100. In this embodiment the width is measured in a lateral direction with respect to the second main surface 11 of the semiconductor substrate 1, and the height is measured in a direction perpendicular to the width.

FIG. 3 illustrates a further embodiment. According to the embodiment illustrated in FIG. 3, the shielding member 40 may extend over only a portion of the width of the gate pad 41. For example, the gate pad 41 may have a width d1+d2+d3 which is measured along a lateral direction with respect to the second main surface 11 of the semiconductor substrate 1. The shielding member 40 has the width d1+d3 overlapping with the gate pad 41, and the width d2 designates the width along which the gate pad 41 does not overlap the shielding member 40. By setting appropriate values for d1, d2 and d3, for example, by an appropriate design of the semiconductor device, the ratio of $C_{GS}/C_{GD}$ can be tuned in a wide range according to the ratio of d1+d3 to d2.

In the embodiment of FIG. 3, the surface portion in which the gate pad 41 is formed may include mesas 14 and, optionally, grooves 15. Further, the shielding member 40 is implemented by doped portions 43, 44. In this case, the width of the mesas 14 and the width of the grooves 15 and further the width of the doped portions 43, 44 are set so as to provide a predetermined ratio $C_{GS}/C_{GD}$ in the contact region II. Although FIG. 3 shows that in the contact region II the groove 15 is formed in the first main surface 10 of the semiconductor substrate 1, it is clearly to be understood that the first main surface 10 may also be a plane surface in the contact region II, as is also illustrated in FIG. 1. According to such an embodiment, the widths d1, d2 and d3 can be adjusted by defining the width of the gate pad 41 and the width of the shielding member 40 using conventional methods.

According to a further embodiment, the gate-source capacitance may be further increased. For example, in the cell region I the source electrode 22 may be disposed over the gate electrode 21, and an interlayer dielectric (ILD) 24 is disposed between the gate electrode 21 and the source electrode 22. According to this embodiment, the gate-source capacitance may be increased by reducing the thickness of the interlayer dielectric 24 as is also illustrated in FIG. 3. Further, a so-called high-k dielectric such as aluminum oxide or hafnium oxide may be used as the interlayer dielectric so as to further increase the gate-source capacitance.

FIG. 4 shows a further embodiment, in which in addition to the embodiments illustrated in FIGS. 1 to 3, a termination region 51 of the doped portion 27 of the semiconductor device 100 is connected to the source potential, the termination region 51 being disposed in an edge region of the semiconductor chip. In the embodiment illustrated in FIG. 4, the doped portions 23 and 27 in the termination region 51 are in contact with an electrode 52 which is held at an electrical potential of the source electrode 22 and which forms a source contact. As a result, the termination region 51 having a comparably large area does not contribute to the gate drain capacitance, whereby the $C_{GS}/C_{GD}$ ratio is further increased. Further, the region 26 contributes to the gate source capacitance.

As has been explained above due to the presence of a shielding member, the contribution of the gate pad to the gate-drain capacitance may be reduced or even eliminated. As a consequence, it becomes possible to increase the gate-source capacitance/gate-drain capacitance ratio even in case the gate pad has a comparably large size when compared to the gate electrode in the cell region I which may be the case when the chip area is further reduced, whereby the contribution of the size of the gate pad to the gate capacitance increases. As a result, losses may be avoided and the re-turn-on affinity of the switching element, for example, the JFET switch can be reduced.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising a transistor in a semiconductor body having a first and a second main surface, the semiconductor body comprising a semiconductor substrate of a second conductivity type and the transistor comprising:
   a gate electrode in contact with a semiconductor portion of a first conductivity type;
   a source electrode in contact with a semiconductor portion of the second conductivity type;

a drain electrode on the second main surface and electrically connected with a portion of the semiconductor substrate, the source electrode being connected with the portion of the semiconductor substrate by an ohmic contact;

a gate pad laterally separated from the gate electrode and electrically connected to the gate electrode; and a shielding member comprising a first semiconductor portion of the first conductivity type and a second semiconductor portion of the second conductivity type, the first semiconductor portion being electrically connected to the source electrode via a low-ohmic connection, the second semiconductor portion being disposed over the first semiconductor portion, on a side closer to the first main surface of the semiconductor body, the second semiconductor portion having a doping concentration higher than the doping concentration of the semiconductor substrate, the shielding member being disposed between the gate pad and the drain electrode such that the first semiconductor portion and the second semiconductor portion each horizontally overlap the gate pad.

2. The semiconductor device of claim 1, wherein the semiconductor portion of the first conductivity type in contact with the gate electrode forms a horizontal layer.

3. The semiconductor device of claim 1, wherein the first conductivity type is p type and the second conductivity type is n type.

4. The semiconductor device of claim 1, wherein the first semiconductor portion and the second semiconductor portion of the shielding member form horizontal layers.

5. The semiconductor device of claim 1, wherein the semiconductor substrate is a silicon carbide substrate.

6. A semiconductor device comprising a transistor in a semiconductor body having a first and a second main surface, the semiconductor body comprising a semiconductor substrate of a second conductivity type and the transistor comprising:

a gate electrode in contact with a semiconductor portion of a first conductivity type;

a source electrode in contact with a semiconductor portion of the second conductivity type;

a drain electrode on the second main surface and electrically connected with a portion of the semiconductor substrate, the source electrode being connected with the portion of the semiconductor substrate by an ohmic contact;

a gate pad laterally separated from the gate electrode and electrically connected to the gate electrode; and a shielding member comprising a first semiconductor portion of the first conductivity type and a second semiconductor portion of the second conductivity type, the first semiconductor portion being in direct contact with a metal layer implementing the source electrode, the shielding member being disposed between the gate pad and the drain electrode such that the first semiconductor portion and the second semiconductor portion each horizontally overlap the gate pad.

7. The semiconductor device of claim 6, wherein the second semiconductor portion is disposed over the first semiconductor portion, on a side closer to the first main surface of the semiconductor substrate.

8. The semiconductor device of claim 6, wherein the semiconductor portion of the first conductivity type in contact with the gate electrode forms a horizontal layer.

9. The semiconductor device of claim 6, wherein the first conductivity type is p type and the second conductivity type is n type.

10. The semiconductor device of claim 6, wherein the semiconductor substrate is a silicon carbide substrate.

11. The semiconductor device of claim 6, wherein the second semiconductor portion of the shielding member has a doping concentration higher than the doping concentration of the semiconductor substrate.

12. The semiconductor device of claim 6, wherein the first semiconductor portion and the second semiconductor portion of the shielding member form horizontal layers.

13. A semiconductor device comprising a transistor in a semiconductor body having a first and a second main surface, the semiconductor body comprising a semiconductor substrate of a second conductivity type and the transistor comprising:

a gate electrode in contact with a semiconductor portion of a first conductivity type;

a source electrode in contact with a semiconductor portion of the second conductivity type;

a drain electrode on the second main surface and electrically connected with a portion of the semiconductor substrate, the source electrode being connected with the semiconductor substrate portion by an ohmic contact;

a gate pad laterally separated from the gate electrode and electrically connected to the gate electrode; and a shielding member comprising a first semiconductor portion of the first conductivity type and a second semiconductor portion of the second conductivity type, the first semiconductor portion being electrically connected to the source electrode via a low-ohmic connection, the second semiconductor portion being disposed over the first semiconductor portion, on a side closer to the first main surface of the semiconductor body, the shielding member being disposed between the gate pad and the drain electrode such that the first semiconductor portion and the second semiconductor portion each horizontally overlap the gate pad.

14. The semiconductor device of claim 13, wherein the semiconductor portion of the first conductivity type in contact with the gate electrode forms a horizontal layer.

15. The semiconductor device of claim 13, wherein the first conductivity type is p type and the second conductivity type is n type.

* * * * *